US009523145B2

(12) United States Patent
Larsson et al.

(10) Patent No.: US 9,523,145 B2
(45) Date of Patent: Dec. 20, 2016

(54) COATED CUTTING INSERT

(71) Applicant: SECO TOOLS AB, Fagersta (SE)

(72) Inventors: Tommy Larsson, Angelsberg (SE); Peter Lofroth, Karlskoga (SE); Hanna Kallerhult, Ostersund (SE); Hindrik Engstrom, Soderbarke (SE); Jan Qvick, Virsbo (SE)

(73) Assignee: SECO TOOLS AB, Fagersta (SE)

( * ) Notice: Subject to any disclaimer, the term of this patent is extended or adjusted under 35 U.S.C. 154(b) by 65 days.

(21) Appl. No.: 14/411,918

(22) PCT Filed: Jun. 20, 2013

(86) PCT No.: PCT/EP2013/062873
§ 371 (c)(1),
(2) Date: Dec. 30, 2014

(87) PCT Pub. No.: WO2014/001190
PCT Pub. Date: Jan. 3, 2014

(65) Prior Publication Data

US 2015/0218689 A1 Aug. 6, 2015

(30) Foreign Application Priority Data

Jun. 29, 2012 (EP) .................................... 12004857

(51) Int. Cl.

| | |
|---|---|
| ***C23C 14/06*** | (2006.01) |
| ***C23C 14/32*** | (2006.01) |
| ***C23C 28/04*** | (2006.01) |
| ***C23C 28/00*** | (2006.01) |
| ***C23C 30/00*** | (2006.01) |

(52) U.S. Cl.
CPC ......... *C23C 14/0641* (2013.01); *C23C 14/325* (2013.01); *C23C 28/044* (2013.01); *C23C 28/42* (2013.01); *C23C 30/00* (2013.01); *C23C 30/005* (2013.01); *Y10T 428/265* (2015.01)

(58) Field of Classification Search
USPC ... 51/307, 309; 428/216, 336, 697, 698, 699
See application file for complete search history.

(56) References Cited

U.S. PATENT DOCUMENTS

| | | | | |
|---|---|---|---|---|
| 2007/0148497 A1* | 6/2007 | Sundstrom | C23C 16/30 | 428/698 |
| 2007/0160844 A1* | 7/2007 | Hessman | C23C 16/30 | 428/408 |
| 2007/0178330 A1* | 8/2007 | Sjolen | C23C 14/0641 | 428/697 |

FOREIGN PATENT DOCUMENTS

| | | | |
|---|---|---|---|
| EP | 1722009 | A1 | 11/2006 |
| EP | 2 392688 | * | 12/2011 |
| JP | 2011-104737 | * | 6/2011 |
| JP | 2011-189436 | * | 9/2011 |
| WO | 02/14569 | A2 | 2/2002 |
| WO | 2009035396 | A1 | 3/2009 |
| WO | 2010/002344 | * | 1/2010 |
| WO | 2010140958 | A1 | 12/2010 |
| WO | 2012069475 | A1 | 5/2012 |

OTHER PUBLICATIONS

Zhitomirsky et al: "Sturcture and properties of cathodic vacuum arc deposited NbN and NbN-based multi0component and multi-layer coatings". Surface and Coatings Technology, Elsevier, Amsterdam, NL. vol. 201. No. 13, Feb. 8, 2007, pp. 6122-6130.

* cited by examiner

*Primary Examiner* — Archene Turner
(74) *Attorney, Agent, or Firm* — Corinne R. Gorski

(57) ABSTRACT

A cutting tool insert having a cemented carbide substrate and a coating including a layer of NbN, wherein the cemented carbide substrate includes 11-12.5 wt % cobalt, 0.2-1.2 wt % chromium, and 86.3-88.4 wt % wolfram carbide.

16 Claims, No Drawings

COATED CUTTING INSERT

RELATED APPLICATION DATA

This application is a §371 National Stage Application of PCT International Application No. PCT/EP2013/062873 filed Jun. 20, 2013 claiming priority of EP Application No. 12004857.4, filed Jun. 29, 2012.

TECHNICAL FIELD OF THE INVENTION

The present invention relates to a coated cutting insert comprising a cemented carbide substrate.

BACKGROUND OF THE INVENTION

Machining of titanium based alloys is generally characterized by that the tool life is short and the rate of metal removal is low. This is due to high temperatures and unfavourable temperature distribution in the tools. Wet machining is normally used in order to minimise the generation of heat, thereby increasing the tool life.

Titanium based alloys are generally divided into three groups of alloys: alpha, alpha+beta and beta alloys. Alloying elements such as Al, V, Sn stabilise the various types of alloys and modify their properties.

Uncoated cemented carbide cutting inserts have traditionally been used for the machining of titanium based alloys. However, during recent years it has been more common to use coated carbide substrates, where the substrate has a relative high cobalt-content. For example, EP1307602A1 discloses a chromium containing cemented carbide substrate consisting of between 10.4 and 12.7 weight percent (wt %) cobalt, between 0.2 and 1.2 wt % chromium, and further tungsten and carbon. The substrate has a coating including a base layer of titanium carbonitride.

WO2009/035396A1, the content of which is hereby incorporated by reference, discloses a cutting tool insert, particularly useful for machining of titanium based alloys. The insert comprises a cemented carbide substrate and a coating. The cemented carbide has a composition of 4-14 wt % Co, up to 5 wt % of the elements Ti, Ta and/or Nb and/or Cr or other elements from groups IVB, VB or VB and rest WC. The coating is composed of one or more layers of refractory compounds of which at least one layer comprise crystalline cubic NbN.

EP1722009A1 discloses a cutting tool insert, solid end mill, or drill, comprising a substrate and a coating composed of one or more layers of refractory compounds of which at least one layer comprises a h-Me1Me2X phase, where Me1 is one or several of the elements V, Cr, Nb, and Ta, and Me2 is one or several of the elements Ti, Zr, Hf, Al, and Si and X is one or several of the elements N, C, O or B.

U.S. Pat. No. 5,325,747 discloses a coated cutting tool insert comprising a substrate and a coating comprising at least one CVD layer, which may have a residual tensile stress, and at least one layer having a high residual compressive stress. The outermost layer of the coating is preferably the one containing residual compressive stresses. The substrate is a composite having hard refractory grains. The cutting tool has been found to be particularly useful in the machining of titanium alloys and super alloys.

Although earlier coated cutting inserts have satisfactory performance, it is still a desire to provide a cutting insert that has improved cutting properties when it comes to withstanding mechanical shocks and thermal shocks during machining of a work piece, especially in a milling operation.

OBJECT OF THE INVENTION

It is an object of the invention to provide a cutting tool insert for machining of titanium alloys by chip removal with improved cutting properties such that an increased life expectancy of the cutting tool insert is achieved.

SUMMARY OF THE INVENTION

According to one aspect of the invention the above mentioned object is achieved by a cutting tool insert comprising a cemented carbide substrate and a coating comprising a layer of NbN, wherein the cemented carbide substrate comprises 11-12.5 wt % cobalt (Co), 0.2-1.2 wt % chromium (Cr), and 86.3-88.4 wt % wolfram carbide (WC), and that the cemented carbide substrate has a coercivity of 11-19 kA/m. Thereby a cutting tool with excellent cutting properties and increased tool life is achieved. It has been found that having a substrate with the above mentioned composition, in combination with a coating comprising a layer of NbN outperforms prior known cutting tools used for machining titanium based alloys.

According to one embodiment of the invention, the cemented carbide substrate comprises 11.5-12.5 wt % Co. With a cobalt content in this interval combined with the coating comprising a NbN layer the cutting properties of the cutting insert are further improved.

According to one embodiment of the invention, the cemented carbide substrate comprises 0.4-1.1 wt % Cr, preferably 0.7-1.1 wt % Cr.

According to on embodiment of the invention, the cemented carbide substrate has a coercivity of 13-19 kA/m, preferably 13-17.5 kA/m.

According to one embodiment of the invention, the cemented carbide comprises 0.05-0.20 wt % metals selected from the group consisting of Ti, Nb, Ta, and combinations thereof.

According to one embodiment of the invention, the layer of NbN has a thickness between 0.5 and 5 μm. The layer- and coating thicknesses mentioned in this description and appended claims are measured in an area adjacent to the cutting edge.

According to one embodiment of the invention the layer of NbN has a thickness between 0.5 and 4 μm, preferably between 0.5 and 3 μm.

According to one embodiment of the invention, the coating comprises a second layer of titanium aluminum nitride (Ti,Al)N. According to one embodiment of the invention, the second layer is arranged between the substrate and the layer of NbN.

According to one embodiment of the invention, the thickness of the second layer is between 0.5 and 5 μm, preferably between 0.5 and 4 μm.

According to one embodiment of the invention, the total thickness of the coating is between 0.5 and 10.0 μm, preferably between 1 and 7 μm.

According to one embodiment of the invention, the layer of NbN comprises cubic NbN (c-NbN, ICDD PDF 38-1155) as detected by X-ray diffraction (XRD) in θ-2θ and/or X-ray gracing incidence geometry.

According to one embodiment of the invention, the layer of NbN comprises hexagonal NbN (h-NbN, ICDD PDF 25-1361) phase such that the area ratio of (h-NbN(103)+h-

NbN(110))/c-NbN(220) is lower than 2.0 as measured by X-ray diffraction (XRD) in θ-2θ and/or X-ray grazing incidence geometry.

According to one embodiment of the invention, the layer of NbN comprises elements from groups IVA-VIA, preferably Ti, Zr, Cr, up to 20 at-%, preferably up to 10 at-%, of the metal content in the layer.

According to one embodiment of the invention, the layer consists of cubic NbN only, as determined by X-ray diffraction (XRD) in θ-2θ geometry.

According to one embodiment of the invention, the layer consists of pure NbN.

According to one embodiment of the invention, the cemented carbide substrate contains only WC, Co, Cr and unavoidable impurities.

According to one embodiment of the invention, the mean intercept length of the tungsten carbide phase measured on a ground and polished cross section is in the interval 0.4-0.75 μm.

According to one embodiment of the invention, the layer and/or the second layer is coated by physical vapor deposition (PVD). Preferably the complete coating is applied with PVD. The PVD method used is preferably arc evaporation. According to an alternative embodiment of the invention, one or more of the layers of the coating could be applied by chemical vapor deposition (CVD).

According to a second aspect of the invention it relates to the use of a cutting tool insert according to the above for machining of titanium based alloys, typically milling of titanium based alloys.

DETAILED DESCRIPTION OF PREFERRED EMBODIMENTS

As described above the invention relates to a coated cutting tool insert comprising a cemented carbide substrate and a coating comprising a layer of NbN, wherein the cemented carbide substrate comprises 11-12.5 wt % Co, 0.2-1.2 wt % Cr, and 86.3-88.4 wt % wolfram carbide (WC).

According to an exemplary embodiment of the invention the substrate is manufactured by powder metallurgical technique, wet milling of powders forming hard constituents and binder phase, compacting the milled mixture to bodies of desired shape and size and sintering. According to the method, a substrate is provided comprising 11-12.5 wt % Co, 0.2-1.2 wt % Cr, and rest WC. The mean intercept length of the tungsten carbide phase measured on a ground and polished representative cross section is in the range 0.4-0.75 μm. The intercept length is measured by means of image analysis on micrographs with a magnification of 10000× and calculated as the average mean value of about 1000 intercept lengths.

The coating is deposited by arc evaporation and composed of one or more layers of refractory compounds of which at least one layer comprises crystalline cubic NbN (c-NbN, PDF 38-1155) as detected by X-ray diffraction (XRD) in θ-2θ and/or X-ray gracing incidence geometry. The NbN-layer may also contains hexagonal NbN (h-NbN, PDF 25-1361) phase such that the area ratio of (h-NbN (103)+h-NbN(110))/c-NbN(220) is lower than 2.0, as measured by X-ray diffraction (XRD) in θ-2θ and/or X-ray grazing incidence geometry.

The layer comprising an NbN phase is deposited by arc evaporation of a cathode, under the following conditions:

The evaporation current is between 70 A and 150 A depending on cathode size and cathode material. When using cathodes of 63 mm in diameter the evaporation current is preferably between 80 A and 140 A.

The substrate bias is between −10 V and −80 V, preferably between −20 V and −60 V.

The deposition temperature is between 400° C. and 700° C., preferably between 500° C. and 700° C.

The atmosphere consists of $N_2$ at a total pressure of 0.5 Pa to 9 Pa, preferably 1 Pa to 5 Pa.

In order to obtain a layer containing mainly c-NbN several deposition parameters have to be fine-tuned. One important factor is the $N_2$ partial pressure, $P_{N2}$. A too low $P_{N2}$ will give h-$Nb_2N$.

The thickness of the NbN layer according to this embodiment is between 1.5 and 2.5 μm.

According to an exemplary embodiment of the invention the cemented carbide body is provided with a coating consisting of one layer of NbN of a crystalline cubic phase (c-NbN, PDF 38-1155), as detected by X-ray diffraction (XRD) using CuKα radiation in θ-2θ and gracing incidence geometry showing one or more of the following features:

a c-NbN (111) peak, at about 35 °2θ,
a c-NbN (200) peak, at about 41 °2θ,
a c-NbN (220) peak, at about 60 °2θ,
a c-NbN (311) peak, at about 71 °2θ, The layer contains an amount of hexagonal NbN (h-NbN, PDF 25-1361) phase such that the area ratio of (h-NbN (103)+h-NbN(110))/c-NbN(220) is lower than 2.0, as measured by X-ray grazing incidence geometry.

EXAMPLES

Tests have been performed in order to find out the possible positive effects of cutting tool inserts designed in accordance with the teaching of the present invention. For this purpose, cutting tool inserts with the physical data presented in table 1 were used. The substrates were produced by means of conventional mixing and milling of powders of the components of the substrate, pressing of green compacts and subsequent sintering of the green compacts at 1430° C. The substrates were then subject to a coating process in which a coating was applied to the substrate by means of a PVD process.

TABLE 1

Composition and physical data of coated cutting inserts.

| | Substrate | | | Coating | |
|---|---|---|---|---|---|
| Grade | Co (wt %) | Cr (wt %) | Coercivity (kA/m) | Coating | Thickness (μm) |
| A | 13.0 | 0.56 | 17.5 | (Ti, Al)N | 2.0 |
| B | 12.0 | 0.90 | 15.4 | (Ti, Al)N | 2.0 |
| C embodiment of invention | 12.0 | 0.90 | 15.4 | NbN | 2.1 |
| D | 13.0 | 0.98 | 15.0 | NbN | 2.1 |

Balance is tungsten (W) and unavoidable impurities

The chromium content in the binder phase is 7.5 wt % for Grade B, C and D

Grade C is a cemented carbide cutting insert according to an exemplary embodiment of the invention, with the composition 12 wt % Co, 0.90 wt % Cr and balance WC. Grade C was produced by conventional milling of powders, pressing of green compacts and subsequent sintering at 1430° C.

Investigation of the microstructure after sintering showed that the mean intercept length of the tungsten carbide phase was 0.58 μm and that the hardness (HV10) was 1455. The substrate was coated, as described below, with a 2.1 μm thick layer of NbN.

Before deposition of NbN on grade C and D, the substrates were cleaned in ultrasonic baths using alkali solution and alcohol and subsequently placed in the PVD-system using a fixture of three-fold rotation. The shortest cathode-to-substrate distance was 130 mm. The system was evacuated to a pressure of less than $2.0\times10^{-3}$ Pa, after which the substrates were sputter cleaned with Ar ions. The layers were grown using arc evaporation of Nb cathodes (63 mm in diameter). The deposition was carried out in a 99.995% pure $N_2$ atmosphere at a total pressure of 3.0 Pa, using a substrate bias of −25 V for 20 minutes. The layer thickness was about 1 μm over the cutting edge. The deposition temperature was about 530° C.

Phase identification of the NbN in as-deposited condition was made by X-ray diffraction using a constant gracing incident angle of 1° between primary beam and sample surface and scanning the detector in order to magnify peaks originating from the layer. The presence of h-NbN is confirmed by the indexing of the diffraction pattern (PDF 25-1361). The area ratio of (h-NbN(103)+h-NbN(110))/c-NbN(220) is 1.1.

(Ti,Al)N layers in grade A and B were deposited using conventional arc technology.

Example 1

Grades A, B and C were tested in square shoulder milling of a Ti-5553 block according to the following:

| | |
|---|---|
| Material: | Titanium Ti-5553 |
| Component | Block |
| Insert type: | XOEX120408R-M07 |
| Cutting speed: | 30 m/min |
| Feed: | 0.12 mm/tooth |
| Depth of cut: | 4 mm |
| Width of cut: | 20 mm |
| Coolant: | Yes |
| Results: | Tool life (min) |
| Grade A | 5.4 |
| Grade B | 5.4 |
| Grade C (embodiment of the invention) | 16.2 |
| Grade C (embodiment of the invention) | 19.8 |

The tests were terminated when the flank wear reached a maximum value of 0.4 mm.

From example 1, comparing grades B and C when used in a milling operation, it can be seen that by changing the coating for grade B from (Ti,Al)N to NbN, the tool life is increased with about three times the tool life of grade B.

Example 2

Grades A, B, C and D were tested in square shoulder milling of a Ti-6-4 titanium block (Ti-6-4) according to the following:

| | |
|---|---|
| Material: | Titanium Ti6-4 |
| Component | Block |
| Insert type: | XOEX120408R-M07 |
| Cutting speed: | 50 m/min |
| Feed: | 0.165 mm/tooth |
| Depth of cut: | 3 mm |
| Width of cut: | 16 mm |
| Coolant: | Yes |
| Results: | Tool life (min) |
| Grade A | 3 |
| Grade B | 15 |
| Grade C (embodiment of invention) | 25 |
| Grade D | 12 |

The tests were terminated when the flank wear reached a maximum value of 0.4 mm.

From example 2, where grades A and B are used in a milling operation of Ti 6-4, it can be seen that by lowering the cobalt content with 1 weight %, and slightly decreasing the chromium content, the tool life for grade B is increased five times the tool life of grade A.

If the cobalt content is decreased with 1 wt %, from 13 wt % to 12 wt %, in the substrate of grade D, thereby forming new grade C, the tool life of grade C will be about twice the tool life of grade D, when milling Ti6-4. It can also be seen that when the coating for grade B is changed from (Ti,Al)N to NbN the tool life is increased with about 70% of the tool life for grade B.

CONCLUSION FROM EXAMPLES 1 AND 2:

From examples 1 and 2 it can be seen that a surprising increase in tool life is obtained in a milling operation of Ti 6-4 or Ti-5553, for a cutting insert with a well-defined cobalt content interval in combination with a coating comprising an NbN-layer.

It should be understood that alternative embodiments within the claimed scope of protection as defined in the annexed patent claims will be obvious to a person skilled in the art. Such alternative embodiments are to be regarded as within the claimed scope of protection and therefore part of the claimed invention.

For example, although the above embodiments have been described with reference to layer(s) containing c-NbN phase deposited using arc evaporation, it is obvious that c-NbN phase containing layer(s) also could be produced using other PVD-technologies such as magnetron sputtering, electron beam evaporation, ion plating or laser ablation. Also, although the invention has been described only in connection with milling of titanium alloys it is to be understood that the invention could also be used for other types of machining operations, for example, turning, and for machining in other types of working material, for example, steel, stainless steel or super alloys.

The invention claimed is:

1. A cutting tool insert comprising a cemented carbide substrate and a coating comprising a layer of NbN, wherein the cemented carbide substrate comprises 11-12.5 wt % Co, 0.7-1.1 wt % Cr, and 86.3-88.4 wt % WC, and that the cemented carbide substrate has a coercivity of 11-19 kA/m.

2. A cutting tool insert according to claim 1, wherein the cemented carbide substrate comprises 11.5-12.5 wt % Co.

3. A cutting tool insert according to claim 1, wherein the cemented carbide substrate has a coercivity of 13-19 kA/m.

4. A cutting tool insert according to claim 1, wherein the cemented carbide substrate has a coercivity of 13-17.5 kA/m.

5. A cutting tool insert according to claim 1, wherein the layer of NbN has a thickness between 0.5 and 5 μm.

6. A cutting tool insert according to claim 1, wherein the layer of NbN has a thickness between 0.5 and 3 μm.

7. A cutting tool insert according to claim 1, wherein the coating comprises a second layer of titanium aluminum nitride arranged between the substrate and the layer of NbN.

8. A cutting tool insert according to claim 7, wherein the second layer has a thickness between 0.5 and 5 μm.

9. A cutting tool insert according to claim 1, wherein the total thickness of the coating is between 0.5 and 10.0 μm.

10. A cutting tool insert according to claim 1, wherein the layer of NbN comprises cubic NbN (c-NbN, ICDD PDF 38-1155) as detected by X-ray diffraction (XRD) in Θ-2 Θ and/or X-ray gracing incidence geometry.

11. A cutting tool insert according to claim 10, wherein the layer of NbN comprises hexagonal NbN (h-NbN, ICDD PDF 25-1361) phase such that the area ratio of (h-NbN (103)+h-NbN(110))/c-NbN(220) is lower than 2.0 as measured by X-ray diffraction (XRD) in Θ-2 Θ and/or X-ray grazing incidence geometry.

12. A cutting tool insert according to claim 1, wherein the layer of NbN comprises elements from groups IVA-VIA, such as Ti, Zr, Cr, up to 20 at-%, of the metal content in the layer.

13. A cutting tool insert according to claim 1, wherein the layer of NbN consists of cubic NbN only, as determined by X-ray diffraction (XRD) in Θ-2 Θ geometry.

14. A cutting tool insert according to claim 1, wherein the layer consists of pure NbN.

15. A cutting tool insert according to claim 1, wherein the cemented carbide contains only WC, Co, Cr and unavoidable impurities.

16. A cutting tool according to claim 1, wherein the coating is a PVD coating.

* * * * *